United States Patent
Nishimura et al.

(10) Patent No.: US 10,574,032 B2
(45) Date of Patent: Feb. 25, 2020

(54) SEMICONDUCTOR MODULE AND MANUFACTURING METHOD THEREOF

(71) Applicant: KYOCERA Corporation, Kyoto-shi, Kyoto (JP)

(72) Inventors: Takehiro Nishimura, Kusatsu (JP); Chiaki Doumoto, Goleta, CA (US)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/267,480

(22) Filed: Feb. 5, 2019

(65) Prior Publication Data
US 2019/0260182 A1   Aug. 22, 2019

(30) Foreign Application Priority Data

Feb. 16, 2018   (JP) .................. 2018-026188

(51) Int. Cl.
*H01S 5/24*   (2006.01)
*H01S 5/022*   (2006.01)
*H01S 5/343*   (2006.01)
*H01S 5/22*   (2006.01)
*H01S 5/30*   (2006.01)

(52) U.S. Cl.
CPC ............ *H01S 5/24* (2013.01); *H01S 5/02236* (2013.01); *H01S 5/02256* (2013.01); *H01S 5/2206* (2013.01); *H01S 5/309* (2013.01); *H01S 5/34333* (2013.01); *H01S 5/34346* (2013.01)

(58) Field of Classification Search
CPC ........ H01S 5/24; H01S 5/022; H01S 5/02236; H01S 5/02256; H01S 5/0206; H01S 5/0207; H01S 5/0425; H01S 5/2206; H01S 5/309; H01S 5/34333; H01S 5/34346; H01L 33/20; H01L 33/48; H01L 33/483
See application file for complete search history.

(56) References Cited

U.S. PATENT DOCUMENTS

2003/0031219 A1* 2/2003 Sawaki ............... H01S 5/32341
372/45.01

FOREIGN PATENT DOCUMENTS

JP   2011-119521 A   6/2011

* cited by examiner

*Primary Examiner* — Armando Rodriguez
(74) *Attorney, Agent, or Firm* — Volpe and Koenig, P.C.

(57) ABSTRACT

A semiconductor module of the present disclosure includes: a base body including a groove part of which two inner side surfaces are inclined, the base body including an electrode pad which is provided on at least one inner side surface; and a semiconductor element including a semiconductor substrate including a first surface, a second surface opposite to the first surface, and two side surfaces which are inclined in a diagonal direction to the first surface and are opposite to each other, a semiconductor layer located on the first surface, and an electrode disposed on at least one side surface. The semiconductor element is located in the groove part so that the at least one side surface is disposed along the at least one inner side surface of the base body, and at least one electrode of the semiconductor element is connected to the electrode pad of the base body.

7 Claims, 4 Drawing Sheets

SEMICONDUCTOR MODULE AND MANUFACTURING METHOD THEREOF

CROSS-REFERENCE TO RELATED APPLICATION

This application claims priority to Japanese Patent Application No. 2018-026188, which was filed on Feb. 16, 2018, the contents of which are incorporated herein by reference in its entirety.

BACKGROUND OF THE INVENTION

1. Field of the Invention

The present disclosure relates to a semiconductor module and a manufacturing method thereof.

2. Description of Related Art

An optical semiconductor and a power semiconductor such as a light emitting diode (LED), a laser diode (LD), a vertical cavity surface emitting laser (VCSEL), and the like require a mounting technology excellent in heat radiation which is capable of preventing characteristic deterioration caused by an increase in element temperature that come along with high output. For example, disclosed is a semiconductor laser chip capable of embedding the semiconductor laser chip up to a height of a second metal layer with a heat radiation material such as solder when the semiconductor laser chip is junction-up mounted by forming a cut-out part extending along an optical waveguide in a region including a substrate and further forming the second metal layer in contact with a first metal layer on at least a part of a cut-out surface of the cut-out part (for example, refer to JP-A-2011-119521).

SUMMARY OF THE INVENTION

However, as described above, when the semiconductor laser chip is mounted on a sub-mount, contact between the chip and the sub-mount is limited to the vicinity of a bottom surface of the chip, therefore there is a possibility that sufficient heat radiation performance may not be obtained.

A semiconductor module of the present disclosure may include: a base body including a groove part of which two inner side surfaces are opposite to each other and are inclined so that a groove width becomes narrow in a depth direction of the groove part, the base body including an electrode pad which is provided on at least one inner side surface of the two inner side surfaces; and a semiconductor element including a semiconductor substrate including a first surface, a second surface disposed on a side opposite to the first surface, and two side surfaces which are inclined to the first surface and are opposite to each other, a semiconductor layer located on the first surface of the semiconductor substrate, and an electrode located on at least one side surface of the two side surfaces of the semiconductor substrate, wherein the semiconductor element is located in the groove part so that the at least one side surface is disposed along the at least one inner side surface of the base body, and the electrode located on the at least one side surface of the semiconductor element is connected to the electrode pad of the base body.

A manufacturing method of a semiconductor module of the present disclosure may include: preparing abase body including a groove part of which two inner side surfaces are opposite to each other and are inclined so that a groove width becomes narrow in a depth direction of the groove part, the base body including an electrode pad which is provided on at least one inner side surface of the two inner side surfaces, and a semiconductor element including a semiconductor substrate including a first surface, a second surface disposed on a side opposite to the first surface, and two side surfaces which are inclined to the first surface and are opposite to each other, a semiconductor layer located on the first surface of the semiconductor substrate, and an electrode located on at least one side surface of the two side surfaces of the semiconductor substrate, and locating the semiconductor element in the base body so that the at least one side surface of the semiconductor element is disposed along the at least one inner side surface of the base body and crimping the electrode located on the at least one side surface onto the electrode pad of the base body.

The semiconductor module of the present disclosure is capable of increasing a contact area between the base body and the semiconductor element and capable of improving heat radiation performance, such that a highly reliable semiconductor module is achieved.

Since the manufacturing method of the semiconductor module of the present disclosure has high accuracy of mounting an optical semiconductor element on the base body, a highly reliable semiconductor module is achieved.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
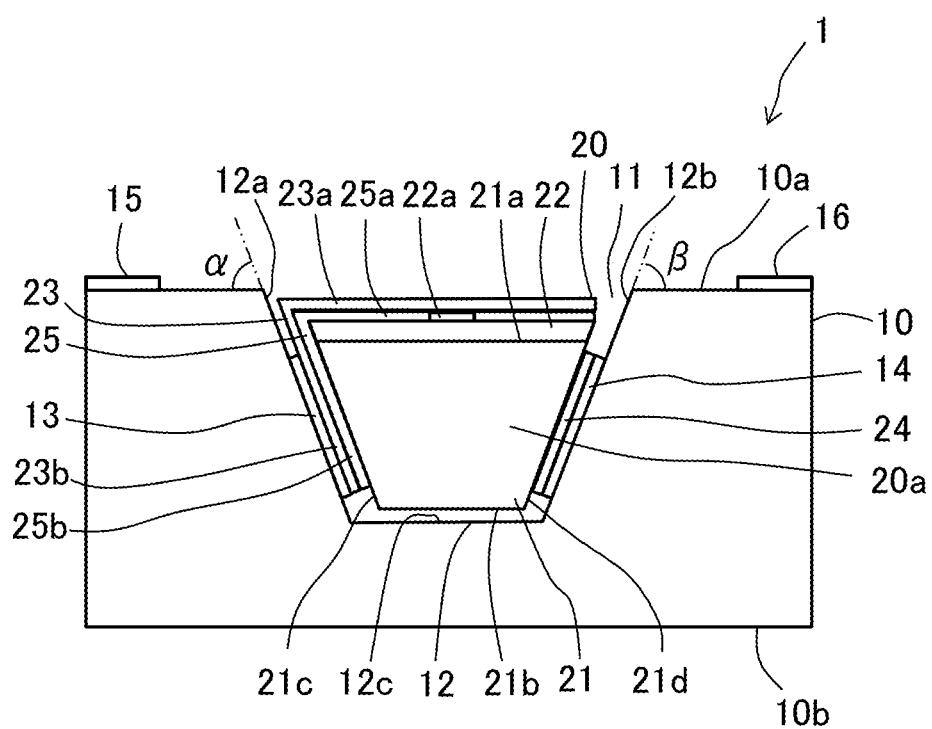
FIG. 1 is a side view illustrating an example of the semiconductor module according to the first embodiment of the present disclosure.

Now referring to the drawings, preferred embodiments of the invention are described below.

Figure 2:
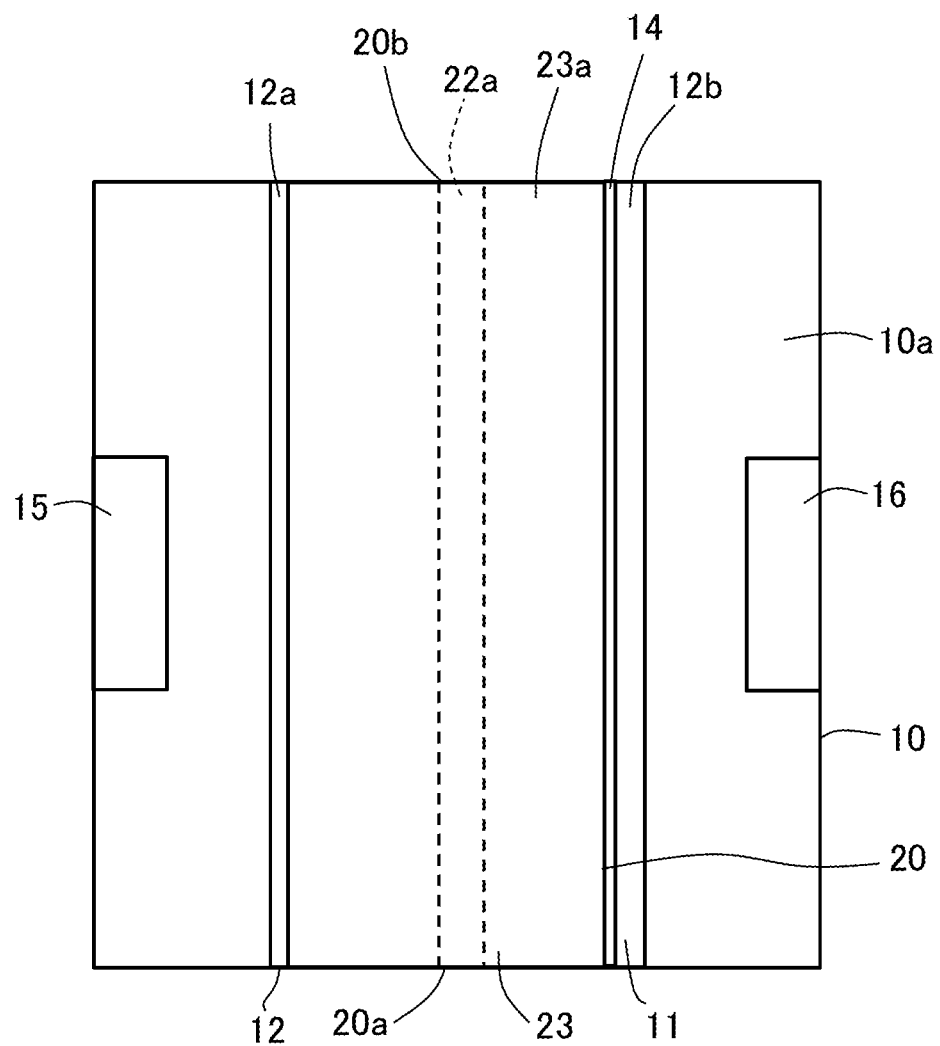
FIG. 2 is a plan view illustrating an example of the semiconductor module according to the first embodiment of the present disclosure.

FIG. 1 is a side view illustrating an example of a semiconductor module according to a first embodiment, and is a view illustrating a semiconductor laser module 1 which is a semiconductor module when viewed from a resonator surface side. FIG. 2 is a plan view illustrating an example of the semiconductor module according to the first embodiment of the present disclosure. For example, the semiconductor laser module 1 is configured by mounting a semiconductor laser element 20 which is a semiconductor element on a mounting substrate 10 which is a base body.

In the present embodiment, the mounting substrate 10 is formed of, for example, an aluminum nitride (AlN) sintered body. In addition to the aluminum nitride sintered body, at least one of an aluminum oxide (alumina: $Al_2O_3$) sintered body, a silicon carbide (SiC) sintered body, a glass ceramic sintered body, a silicon nitride ($Si_3N_4$) sintered body, quartz, diamond, sapphire (single crystal alumina), cubic boron nitride (BN), and silicon (Si) forming a thermal oxide film can be used.

When regarding heat radiation performance of the mounting substrate 10, the mounting substrate 10 is desirably formed of aluminum nitride sintered body, silicon carbide sintered body, diamond, and silicon. Since these materials have high thermal conductivity of 40 W/(m·K) or higher, even though the semiconductor laser element 20 adhesively fixed to a groove part 12 of the mounting substrate 10 generates heat during driving, the generated heat is desirably transmitted via the mounting substrate 10. Therefore, heat is easily radiated from the semiconductor laser element 20, whereby the semiconductor laser element 20 can be normally and stably operated over a long period of time.

For example, the mounting substrate 10 can use a substrate having a thickness of about 100 µm to 1000 µm and including a first surface 10a and a second surface 10b opposite to the first surface 10a. The mounting substrate 10 includes the groove part 12 in which an opening 11 is provided on the first surface 10a. The groove part 12 includes inner side surfaces 12a and 12b which are opposite to each other and a bottom surface 12c. Angles α and β which are formed by the inner side surfaces 12a and 12b and the first surface 10a are, for example, about 25° to 75°. A depth of the groove part 12 varies depending on a size of the semiconductor element to be mounted. For example, the depth thereof is about 40 µm to 400 µm, and, for example, a width of the bottom surface 12c can be about 100 µm to 1000 µm, however, alternatively, the width of the bottom surface 12c may be about 0 µm to 100 µm. When a side geometry of the groove part 12 is a V-shape, the groove part 12 may be construed as a groove including the bottom surface 12c of 0 µm width.

Since the semiconductor laser element 20 mounted on the mounting substrate 10 emits light in a longitudinal direction of the groove part 12, walls of the mounting substrate 10 are not provided at opposite ends of the groove part 12. When a semiconductor element which does not emit light in the longitudinal direction of the groove part 12 such as a VCSEL element is mounted, the walls of the mounting substrate 10 may be provided at the opposite ends of the groove part 12.

An electrode pad 13 is located on the inner side surface 12a of the groove part 12, and an electrode pad 14 is located on the inner side surface 12b of the groove part 12, respectively. The electrode pads 13 and 14 can be connected to a drive circuit outside the mounting substrate 10 via wiring (not illustrated) extending from the electrode pads 13 and 14, thereby making it possible to drive the mounted semiconductor laser element 20. For example, the wiring extending from the electrode pads 13 and 14 may be respectively connected to electrodes 15 and 16 located on the first surface 10a, and the electrodes 15 and 16 may be connected to the drive circuit outside.

The electrode pads 13 and 14 are formed of, for example, a conductor layer having a three-layer structure in which an adhesive metal layer, a diffusion prevention layer, and a main conductor layer are sequentially laminated. Regarding adhesion to an insulation substrate, the adhesive metal layer may be formed of at least one of titanium (Ti), chromium (Cr), thallium (Ta), niobium (Nb), nickel-chromium (Ni—Cr) alloy, thallium nitride ($Ta_2N$), and the like. A thickness of the adhesive metal layer is desirably about 0.01 µm to 0.2 µm. To prevent mutual diffusion between the adhesive metal layer and the main conductor layer, the diffusion prevention layer may be formed of at least one of platinum (Pt), palladium (Pd), rhodium (Rh), nickel (Ni), nickel-chromium (Ni—Cr) alloy, titanium tungsten (Ti—W) alloy, and the like. A thickness of the diffusion prevention layer may be about 0.05 µm to 1 µm. The main conductor layer may be formed of gold (Au), copper (Cu), nickel (Ni), silver (Ag), and the like, all having low electric resistance. A thickness of the main conductor layer may be about 0.1 µm to 5 µm. By using an In or AuSn solder layer as the main conductor layer, electrodes of the semiconductor element can be crimped onto the electrode pads.

The semiconductor laser element 20 mounted on the groove 12 of the mounting substrate 10 includes, for example, a GaN substrate 21 which is a gallium nitride (GaN) semiconductor substrate, a nitride semiconductor layer 22 which is a semiconductor layer formed on the GaN substrate 21, a p-electrode 23 which is formed on the GaN substrate 21 and the nitride semiconductor layer 22, and an n-electrode 24 which is formed on the GaN substrate 21.

The n-type GaN substrate 21 forming the semiconductor laser element 20 is, for example, a transparent substrate in which normal lines of a first surface 21a and a second surface 21b form an off-angle about a c-axis direction or a c-axis, and a thickness thereof is about 40 µm to 400 µm. The GaN substrate 21 can be formed of a GaN wafer and the like having a diameter of about 2 inches. The GaN substrate 21 is transparent, doped with an n-type dopant such as Si, and has conductivity.

When viewed from a resonator surface 20a of the semiconductor laser element 20, in the GaN substrate 21, an upper bottom thereof is the first surface 21a and a lower bottom thereof is the second surface 21b, and a shape thereof is a trapezoidal shape, the upper bottom of which being longer than the lower bottom. An inclined surface 21c is a surface having an inclination along the inner side surface 12a. An inclined surface 21d is a surface having an inclination along the inner side surface 12b. The second surface 21b is opposite to the bottom surface 12c of the groove part 12 of the mounting substrate 10.

The nitride semiconductor layer 22 is a semiconductor layer which is formed on the first surface 21a of the GaN substrate 21 by epitaxially growing the nitride semiconductor. The nitride semiconductor layer 22 includes a ridge part 22a which is a strip-shape protruding part on a side opposite to the GaN substrate 21. An insulation film 25 is located on a portion excluding an upper surface of the ridge part 22a of the nitride semiconductor layer 22. The p-electrode 23 which is a first electrode is located on the nitride semiconductor layer 22. In the present embodiment, the insulation film 25 is located on the nitride semiconductor layer 22 other than the ridge part 22a, and the p-electrode 23 is located on the nitride semiconductor layer 22 via the insulation film 25 at the ridge part 22a. Accordingly, the nitride semiconductor layer 22 and the p-electrode 23 are not required to be electrically connected to each other on the whole surface, and according to the present embodiment, the portion other than the ridge part 22a under the p-electrode 23 is covered with the insulation film 25.

The insulation film 25 includes a first insulation film part 25a located on the nitride semiconductor layer 22, and a second insulation film part 25b which is a portion extending from the first insulation film part 25a onto the inclined surface 21c and a side surface of the nitride semiconductor layer 22 which are respectively one side surface of the GaN substrate 21 and one side surface of the nitride semiconductor layer 22. The p-electrode 23 includes a first p-electrode part 23a located on the ridge part 22a and the first insulation film part 25a, and a second p-electrode part 23b which is a portion extending from the p-electrode 23a onto the second insulation film part 25b. The p-electrode 23 is located over the inclined surface 21c from over the nitride semiconductor layer 22. The p-electrode 23 is formed of a single layer film of an opaque metal, a multilayer film, or an alloy film, and, for example, a multilayer film in which nickel (Ni), gold (Au), and platinum (Pt) are sequentially laminated can be used.

The n-electrode 24 is formed on the inclined surface 21d which is one side surface of the GaN substrate 21. The n-electrode 24 is not formed on the side surface of the nitride semiconductor layer 22. The n-electrode 24 is formed of a single-layer metal film, a multilayer film, or an alloy film, and, for example, a multilayer film in which vanadium (V), platinum (Pt), and gold (Au) are sequentially laminated can be used.

Figure 3:
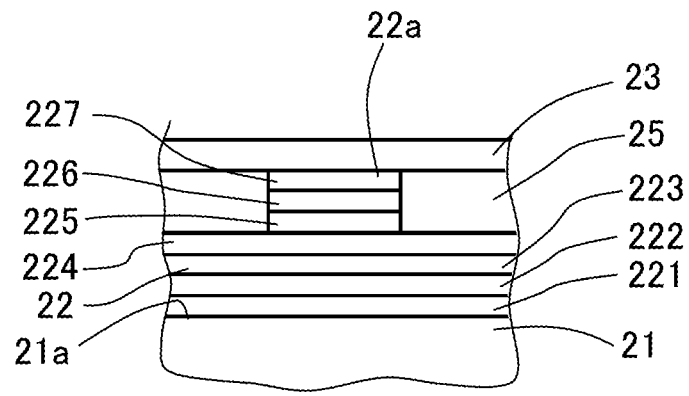
FIG. 3 is a partial side view illustrating an example of the semiconductor module according to the first embodiment of the present disclosure.

FIG. 3 illustrates an enlarged view in the vicinity of the ridge part of the semiconductor laser element 20. The nitride semiconductor layer 22 laminated on the first surface 21a of the GaN substrate 21 is formed by laminating nitride semiconductors by vapor deposition. As vapor deposition, metal organic chemical vapor deposition (MOCVD) using an organic metal as a group III raw material can be used. Further, vapor deposition such as hydride vapor phase epitaxy (HVPE) using chloride as the group III raw material, or molecular beam epitaxy (MBE) may be used.

The nitride semiconductor layer 22 on the GaN substrate 21 is formed by laminating thin films of the nitride semiconductors, and a thickness of the nitride semiconductor layer 22 is about 2 μm to 4 μm. For example, the nitride semiconductor layer 22 is formed by laminating a first n-type nitride semiconductor layer 221, a second n-type nitride semiconductor layer 222, an active layer 223, a first p-type nitride semiconductor layer 224, a second p-type nitride semiconductor layer 225, a third p-type nitride semiconductor layer 226, and a fourth p-type nitride semiconductor layer 227 on the first surface 21a of the GaN substrate 21 in this order. The nitride semiconductor layer 22 includes a mixed crystal of InN, AlN, GaN as a main component, which can be represented by a composition formula of $In_xAl_yGa_{1-x-y}N$ ($0 \leq x \leq 1$, $0 \leq y \leq 1$, $0 \leq x+y \leq 1$). As an n-type impurity contained in the nitride semiconductor layer 22, silicon (Si), germanium (Ge), tin (Sn), sulfur (S), oxygen (O), titanium (Ti), zirconium (Zr), cadmium (Cd), and the like can be used. As a p-type impurity, magnesium (Mg), zinc (Zn), beryllium (Be), manganese (Mn), calcium (Ca), strontium (Sr), and the like can be used.

A layer of Si-doped $Al_{0.05}Ga_{0.95}N$, which is the first n-type nitride semiconductor layer 221 formed on the GaN substrate 21, functions as a clad layer. A GaN layer, which is the second n-type nitride semiconductor layer 222 formed on the first n-type nitride semiconductor layer 221, functions as an optical guide layer.

For example, the active layer 223 can be a multiple quantum well structure in which a layer of undoped $In_{0.02}Ga_{0.98}N$ as a barrier layer and a layer of Si-doped $In_{0.1}Ga_{0.9}N$ as a well layer are repeatedly laminated by changing a component ratio of In and Ga in InGaN.

A layer of Mg-doped $Al_{0.1}Ga_{0.9}N$ which is the first p-type nitride semiconductor layer 224 laminated on the active layer 223 functions as a barrier layer for confining a p-side electron. A layer of Mg-doped GaN which is the second p-type nitride semiconductor layer 225 laminated on the first p-type nitride semiconductor layer 224 functions as an optical guide layer. A layer of Mg-doped $Al_{0.08}Ga_{0.92}N$ which is the third p-type nitride semiconductor layers 226 laminated on the second p-type nitride semiconductor layer 225 function as a clad layer. A layer of Mg-doped GaN which is the fourth p-type nitride semiconductor layer 227 laminated on the third p-type nitride semiconductor layer 226 functions as a contact layer.

The second p-type nitride semiconductor layer 225, the third p-type nitride semiconductor layer 226, and the fourth p-type nitride semiconductor layer 227 form the ridge part 22a. The insulation film 25 formed of silicon dioxide ($SiO_2$) or the like is located on a side of the ridge part 22a. The p-electrode 23 covers over the ridge part 22a and the insulation film 25, and the third p-type nitride semiconductor layer 226 and the p-electrode 23 are connected to each other by ohmic connection. A width of the ridge part 22a is about 1 μm to 30 μm, and a length between the resonator surface 20a and a resonator surface 20b which is a longitudinal direction of the ridge part 22a is about 300 μm to 1000 μm.

When the semiconductor laser element 20 described above is driven, laser is emitted from the resonator surface 20a. At this time, the semiconductor laser element 20 generates heat, the generated heat is conducted to the mounting substrate 10 from the p-electrode 23 and the n-electrode 24 via the electrode pads 13 and 14, and then is radiated. Since electrodes are located on the inner side surfaces 12a and 12b of the groove part 12, a contact area between the semiconductor laser element 20 and the mounting substrate 10 is increased, whereby the heat radiation of the semiconductor laser element 20 is improved. Since the semiconductor laser element 20 is fitted into the groove part 12, the nitride semiconductor layer 22 having a large amount of heat generation and the mounting substrate 10 can be close to each other, whereby heat generated from the nitride semiconductor layer 22 can be quickly radiated to the mounting substrate 10. The semiconductor laser element 20 can be normally and stably operated over a long period of time by improving the heat radiation of the semiconductor laser element 20 as such, thereby making it possible to achieve the highly reliable semiconductor laser module 1.

The semiconductor laser module 1 can be manufactured by fitting the semiconductor laser element 20 into the groove part 12 of the mounting substrate 10. At this time, the semiconductor laser element 20 is pushed into the groove part 12, the second p-electrode part 23b is pressed and crimped to the electrode pad 13 of the mounting substrate 10, and the n-electrode 24 is pressed and crimped to the electrode pad 14 of the mounting substrate 10. Thereby, the semiconductor laser element 20 can be fitted and fixed to the groove part 12 of the mounting substrate 10. For example, before crimping, by forming a gold-tin (Au—Sn) alloy layer on the surfaces of the electrode pads 13 and 14 by sputtering or otherwise in advance, adhesion strength between the mounting substrate 10 and the semiconductor laser element 20 can be improved.

Accordingly, the semiconductor laser element 20 is fixed to the mounting substrate 10 by crimping. Therefore, compared with a configuration in which connection is performed by wire bonding and the like, a contact area between the p-electrode 23 and the electrode pad 13 and a contact area between the n-electrode 24 and the electrode pad 14 can be enlarged. Accordingly, contact resistance decreases and thermal conductivity improves, thereby making it possible to improve heat radiation performance of the semiconductor laser element 20, and to achieve the highly reliable semiconductor laser module 1.

The semiconductor laser element 20 is fitted into the groove part 12. Thereby, since the inner side surfaces 12a and 12b and the inclined surfaces 21c and 21d can be positioned to contact each other, it is possible to improve positioning accuracy of the semiconductor laser element 20 with a simple configuration. In this case, the bottom surface 12c of the groove part 12 and the second surface 21b are fixed while facing each other. When space is present between the second surface 21b and the bottom surface 12c, the p-electrode 23 and the n-electrode 24 are respectively pressed against and fixed to the electrode pads 13 and 14. Accordingly, the semiconductor laser element 20 and the mounting substrate 10 can be firmly fixed to each other. When the second surface 21b is in close contact with the bottom surface 12c, since the contact area between the semiconductor laser element 20 and the mounting substrate 10 is increased, the heat radiation of the semiconductor laser module 1 can be improved.

Figure 4:
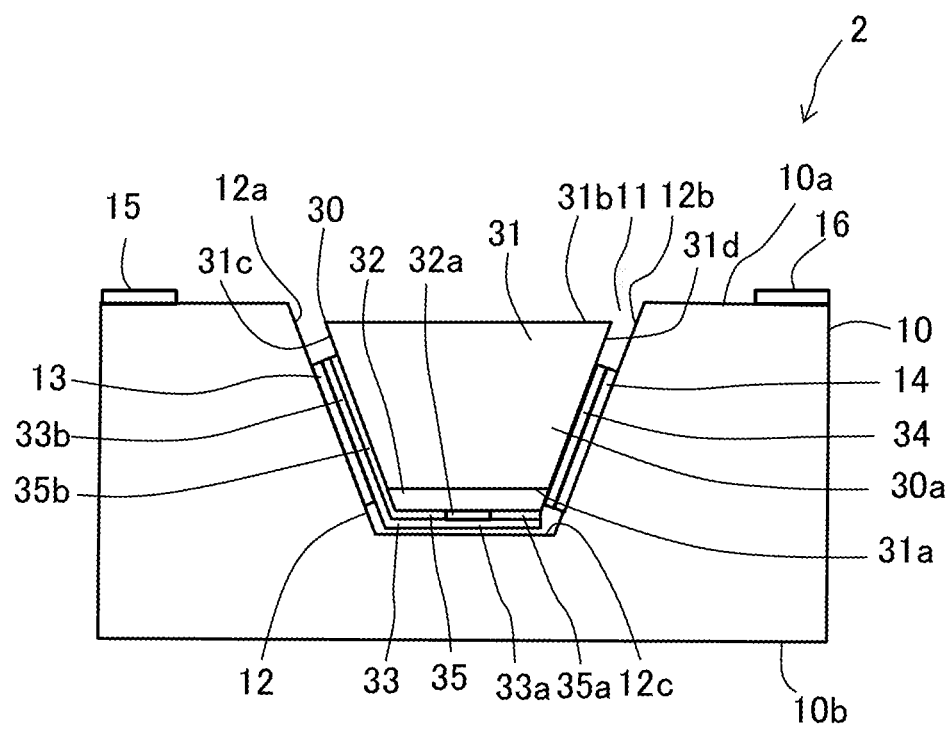
FIG. 4 is a side view illustrating an example of the semiconductor module according to the second embodiment of the present disclosure.
Figure 5:
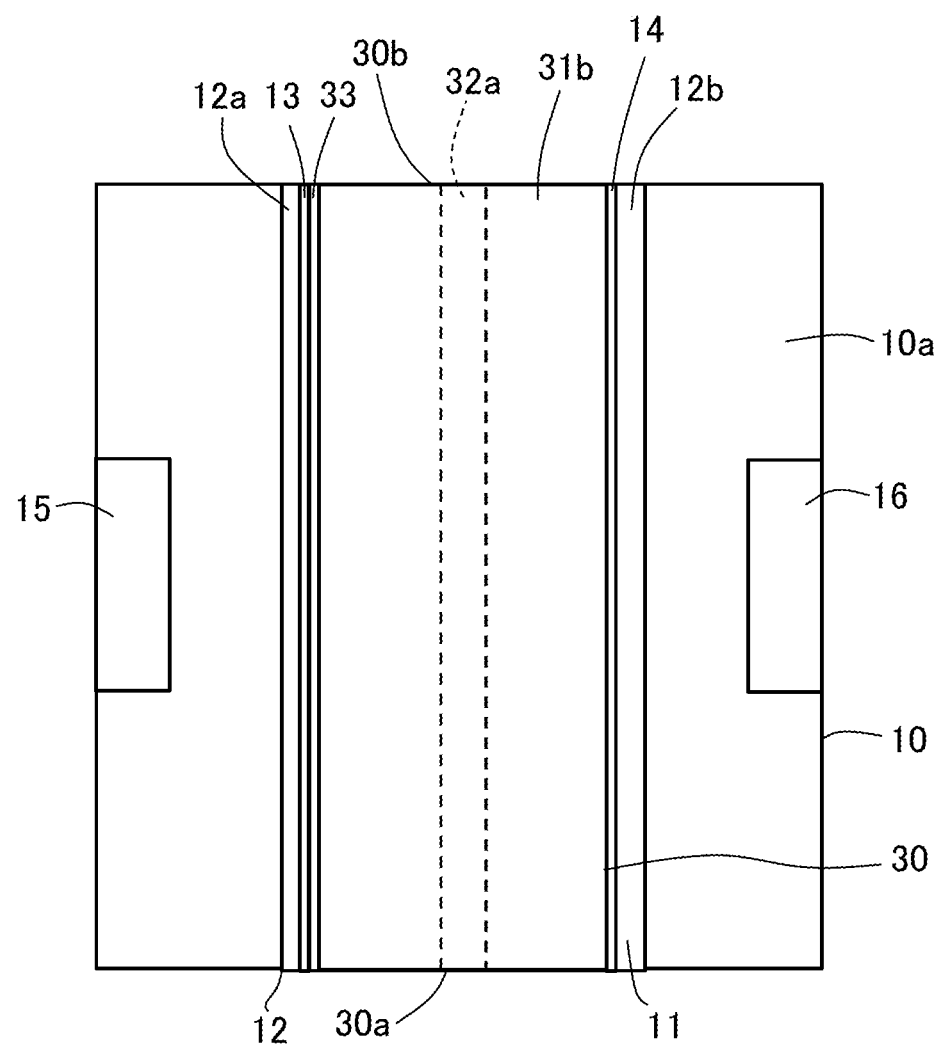
FIG. 5 is a plan view illustrating an example of the semiconductor module according to the second embodiment of the present disclosure.

FIG. 4 is a side view illustrating an example of a semiconductor laser module 2 according to a second embodiment, and is a view illustrating the semiconductor laser module 2 when viewed from a resonator surface side. FIG. 5 is a plan view illustrating an example of the semiconductor module according to the second embodiment of the present disclosure. In the first embodiment, the semiconductor layer formed on the semiconductor substrate is positioned on the opening 11 side of the groove part 12, that is, the mounting is performed in a so-called junction-up state. On the other hand, in the second embodiment, the semiconductor layer formed on the semiconductor substrate is positioned on the bottom surface 12c side of the groove part 12, that is, the mounting is performed in a so-called junction-down state. In the second embodiment, since a configuration of the mounting substrate 10 is the same as that of the first embodiment, descriptions thereof will be omitted. For example, the semiconductor laser module 2 is configured by mounting a semiconductor laser element 30 which is a semiconductor element on the mounting substrate 10 which is a base body.

The semiconductor laser element 30 mounted on the groove part 12 of the mounting substrate 10 is formed by including a GaN substrate 31 which is a semiconductor substrate, a nitride semiconductor layer 32 which is a semiconductor layer formed on the GaN substrate 31, a p-electrode 33 which is formed on the GaN substrate 31 and the nitride semiconductor layer 32, and an n-electrode 34 which is formed on the GaN substrate 31.

The n-type GaN substrate 31 forming the semiconductor laser element 30 is, for example, a transparent substrate in which normal lines of a first surface 31a and a second surface 31b form an off-angle about a c-axis direction or a c-axis, and a thickness thereof is about 40 μm to 400 μm. The GaN substrate 31 can be formed of a GaN wafer having a diameter of about 2 inches or the like. The GaN substrate 31 is transparent, doped with an n-type dopant such as Si and the like, and has conductivity.

When viewed from a direction of a resonator surface 30a, in the GaN substrate 31, an upper bottom thereof is the second surface 31b and a lower bottom thereof is the first surface 31a, and a shape thereof is a trapezoidal shape, the upper bottom of which being longer than the lower bottom thereof. An inclined surface 31c is a surface having an inclination along the inner side surface 12a, and an inclined surface 31d is a surface provided along the inner side surface 12b.

The nitride semiconductor layer 32 is formed by epitaxially growing the nitride semiconductor on the first surface 31a of the GaN substrate 31. The nitride semiconductor layer 32 includes a ridge part 32a which is a strip-shape protruding part on a side opposite to the GaN substrate 31.

An insulation film 35 is located at a portion excluding an upper surface of the ridge part 32a of the nitride semiconductor layer 32. The p-electrode 33 which is a first electrode is located on the nitride semiconductor layer 32. In the present embodiment, the insulation film 35 is located on the nitride semiconductor layer 32 in a region other than the ridge part 32a, and the p-electrode 33 is located on the nitride semiconductor layer 32 via the insulation film 35 at the region. Accordingly, the nitride semiconductor layer 32 and the p-electrode 33 are not required to be electrically connected to each other on the whole surface, and according to the present embodiment, the portion other than the ridge part 32a under the p-electrode 33 is covered with the insulation film 35.

The insulation film 35 includes a first insulation film part 35a located on the nitride semiconductor layer 32, and a second insulation film part 35b which is a portion extending from the first insulation film part 35a onto the inclined surface 31c and a side surface of the nitride semiconductor layer 32 which are respectively one side surface of the GaN substrate 31 and one side surface of the nitride semiconductor layer 32. The p-electrode 33 includes a first p-electrode part 33a located on the ridge part 32a and the first insulation film 35a, and a second p-electrode part 33b which is a portion extending from the first p-electrode part 33a onto the second insulation film part 35b. The p-electrode 33 is located over the inclined surface 31c from an upper part of the nitride semiconductor layer 32. The p-electrode 33 is formed of a single layer film of an opaque metal, a multilayer film, or an alloy film, and, for example, a multilayer film in which nickel (Ni), gold (Au), and platinum (Pt) are sequentially laminated can be used.

The n-electrode 34 is formed on the inclined surface 31d which is one side surface of the GaN substrate 31. The n-electrode 34 is not formed on the side surface of the nitride semiconductor layer 32. The n-electrode 34 is formed of a single-layer metal film, a multilayer film, or an alloy film, and, for example, a multilayer film in which vanadium (V), platinum (Pt), and gold (Au) are sequentially laminated can be used.

Configurations of the nitride semiconductor layer 32 and the layer of the ridge part 32a are the same as those of the first embodiment. A width of the ridge part 32a is about 1 μm to 30 μm, and a length between the resonator surface 30a and a resonator surface 30b which is a longitudinal direction of the ridge part 32a is about 300 μm to 1000 μm.

Accordingly, the semiconductor laser element 30 is located on the groove part 12 of the mounting substrate 10 so that the first surface 31a of the GaN substrate 31 is opposite to the bottom surface 12c of the groove part 12. Thereby, the nitride semiconductor layer 32 is located in the vicinity of the bottom surface 12c of the groove part 12, and the periphery of the nitride semiconductor layer 32 generating heat is surrounded by the groove part 12, and therefore the heat generated in the nitride semiconductor layer 32 can be quickly diffused.

In the above-mentioned embodiments, the electrode pads 13 and 14 are respectively disposed on the inner side surfaces 12a and 12b of the groove part 12 which are opposite to each other. However, alternatively, an electrode pad which is connected to the n-electrode and an electrode pad which is connected to the p-electrode can be configured to be disposed on either one of the inner side surfaces 12a and 12b. One electrode pad can be configured to be electrically connected to the electrodes 15 and 16 or an external circuit by wire bonding or the like.

In the above-mentioned embodiments, a semiconductor laser element is exemplified as a semiconductor element, however, an LED element, an optical semiconductor element such as a VCSEL, and the like, in which a nitride semiconductor layer is grown on a nitride semiconductor substrate can be also applied to the present invention. In addition to the optical semiconductor element, a power semiconductor element that emits a large amount of heat can be also applied thereto.

The present disclosure may be embodied in other specific forms without departing from the spirit or essential characteristics thereof. The present embodiments are therefore to be considered in all respects as illustrative and not restrictive, the scope of the present disclosure being indicated by the appended claims rather than by the foregoing description and all changes which come within the meaning and the range of equivalency of the claims are therefore intended to be embraced therein.

What is claimed is:

1. A semiconductor module, comprising:
    a base body comprising a groove part of which two inner side surfaces are opposite to each other and are inclined so that a groove width becomes narrow in a depth direction of the groove part, the base body comprising an electrode pad which is provided on at least one inner side surface of the two inner side surfaces; and
    a semiconductor element comprising a semiconductor substrate comprising a first surface, a second surface disposed on a side opposite to the first surface, and two side surfaces which are inclined to the first surface and are opposite to each other, a semiconductor layer located on the first surface of the semiconductor substrate, and an electrode disposed on at least one side surface of the two side surfaces of the semiconductor substrate, wherein
    the semiconductor element is located in the groove part so that the at least one side surface is disposed along the at least one inner side surface of the base body, and the electrode located on the at least one side surface of the semiconductor element is connected to the electrode pad of the base body.

2. The semiconductor module according to claim 1, wherein
    the electrode comprises a first electrode which is located over one side surface of the two side surfaces of the semiconductor substrate from an upper part of the semiconductor layer, and a second electrode which is located on the side surface of the semiconductor substrate, and the first electrode is located on an insulation layer located on the one side surface.

3. The semiconductor module according to claim 1, wherein
    the second surface of the semiconductor element is located to be opposite to a bottom part of the groove part.

4. The semiconductor module according to claim 1, wherein
    the first surface of the semiconductor element is located to be opposite to a bottom part of the groove part.

5. The semiconductor module according to claim 1, wherein
    the semiconductor element comprises an optical semiconductor element.

6. The semiconductor module according to claim 1, wherein
    the semiconductor layer comprises a nitride semiconductor.

7. A manufacturing method of a semiconductor module, comprising:
    preparing abase body comprising a groove part of which two inner side surfaces are opposite to each other and are inclined so that a groove width becomes narrow in a depth direction of the groove part, the base body comprising an electrode pad which is provided on at least one inner side surface of the two inner side surfaces, and a semiconductor element comprising a semiconductor substrate comprising a first surface, a second surface disposed on a side opposite to the first surface, and two side surfaces which are inclined to the first surface and are opposite to each other; a semiconductor layer located on the first surface of the semiconductor substrate; and an electrode located on at least one side surface of the two side surfaces of the semiconductor substrate; and
    locating the semiconductor element in the base body so that the at least one side surface of the semiconductor element is disposed along the at least one inner side surface of the base body and crimping the electrode located on the at least one side surface onto the electrode pad of the base body.

* * * * *